US009165971B2

(12) United States Patent
Greer et al.

(10) Patent No.: US 9,165,971 B2
(45) Date of Patent: Oct. 20, 2015

(54) ATOMICALLY PRECISE SURFACE ENGINEERING FOR PRODUCING IMAGERS

(75) Inventors: Frank Greer, Pasadena, CA (US); Todd J. Jones, Altadena, CA (US); Shouleh Nikzad, Valencia, CA (US); Michael E. Hoenk, Valencia, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 13/281,295

(22) Filed: Oct. 25, 2011

(65) Prior Publication Data

US 2012/0168891 A1 Jul. 5, 2012

Related U.S. Application Data

(60) Provisional application No. 61/406,472, filed on Oct. 25, 2010.

(51) Int. Cl.
*H01L 31/18* (2006.01)
*H01L 31/0232* (2014.01)
*H01L 27/146* (2006.01)

(52) U.S. Cl.
CPC ........ *H01L 27/1464* (2013.01); *H01L 27/1462* (2013.01)

(58) Field of Classification Search
CPC ............................ H01L 31/18; H01L 31/0232
USPC ............ 257/437, 460, 431, E31.127; 438/72, 438/57, 90
See application file for complete search history.

(56) References Cited

U.S. PATENT DOCUMENTS

| 5,376,810 | A | * | 12/1994 | Hoenk et al. ................... 257/228 |
| 5,963,365 | A | * | 10/1999 | Shirai ............................. 359/359 |
| 6,025,585 | A | * | 2/2000 | Holland ...................... 250/208.1 |
| 6,278,119 | B1 | | 8/2001 | Nikzad et al. |
| 6,346,700 | B1 | | 2/2002 | Cunningham et al. |
| 6,403,963 | B1 | | 6/2002 | Nikzad et al. |
| 6,697,194 | B2 | * | 2/2004 | Kuschnereit et al. ......... 359/359 |

(Continued)

FOREIGN PATENT DOCUMENTS

| WO | 2012061152 A2 | 5/2012 |
| WO | 2012061152 A3 | 5/2012 |

OTHER PUBLICATIONS

International Search Report and Written Opinion for international Application PCT/US2011/057734, Report Completed Jun. 27, 2012, mailed Jun. 27, 2012, 6 pgs.

(Continued)

*Primary Examiner* — Sheng Zhu
(74) *Attorney, Agent, or Firm* — KPPB LLP

(57) ABSTRACT

High-quality surface coatings, and techniques combining the atomic precision of molecular beam epitaxy and atomic layer deposition, to fabricate such high-quality surface coatings are provided. The coatings made in accordance with the techniques set forth by the invention are shown to be capable of forming silicon CCD detectors that demonstrate world record detector quantum efficiency (>50%) in the near and far ultraviolet (155 nm-300 nm). The surface engineering approaches used demonstrate the robustness of detector performance that is obtained by achieving atomic level precision at all steps in the coating fabrication process. As proof of concept, the characterization, materials, and exemplary devices produced are presented along with a comparison to other approaches.

15 Claims, 16 Drawing Sheets

(56) References Cited

U.S. PATENT DOCUMENTS

| | | | |
|---|---|---|---|
| 7,250,325 | B2 | 7/2007 | Janesick |
| 7,786,421 | B2 | 8/2010 | Nikzad et al. |
| 7,800,040 | B2 | 9/2010 | Blacksberg et al. |
| 8,283,195 | B2 * | 10/2012 | Meynants ............... 438/57 |
| 2007/0108476 | A1 | 5/2007 | Hong |
| 2007/0210395 | A1 * | 9/2007 | Maruyama et al. ........... 257/431 |
| 2008/0072959 | A1 * | 3/2008 | Chen et al. ............... 136/257 |
| 2008/0111056 | A1 * | 5/2008 | Blacksberg et al. ....... 250/208.1 |
| 2010/0163933 | A1 | 7/2010 | Xu et al. |
| 2010/0180941 | A1 * | 7/2010 | Lim et al. ............... 136/256 |
| 2010/0244173 | A1 * | 9/2010 | Wang et al. ............... 257/435 |
| 2011/0140246 | A1 | 6/2011 | Hoenk et al. |

OTHER PUBLICATIONS

Aleskovskii, "Chemistry and Technology of Solids", J. Appl. Chem., 2007, vol. 47, pp. 2207-2217.
Barth, "Planetary Ultraviolet Spectroscopy", Applied Optics, Jul. 1969, vol. 8, No. 7, pp. 1295-1304.
Burke et al., "Large-Area Back-Illuminated CCD Imager Development", Experimental Astronomy, 1998, vol. 8, pp. 31-40.
Chan et al., "EUV mask Defect Inspection and Defect Review Strategies for EUV Pilot Line and High Volume Manufacturing", Proc. of SPIE, vol. 7636, pp. 76361D-1-76361D-16.
Hamden et al., "Ultraviolet antireflection coatings for use in silicon detector design", Applied Optics, Jul. 20, 2011, vol. 50, No. 21, pp. 4180-4188.
Hendrix et al., "The ultraviolet reflectance of Enceladus: Implications for surface composition", Icarus, 2010, vol. 206, pp. 608-617.
Hoenk et al., "Growth of a delta-doped silicon later by molecular beam epitaxy on a charge-coupled device for reflection-limited ultraviolet quantum efficiency", Appl. Phys. Letter Aug. 31, 11992, vol. 61, No. 9, pp. 1084-1086.
Jacquot et al., "A system and methodologies for absolute quantum efficiency measurements from the vacuum ultraviolet through the near infrared", Review of Scientific Instruments, 2011, vol. 82, pp. 043102-1-043102-10.
Joseph, "UV detective quantum efficiency measurements", SPIE, Jul. 1999, vol. 3764, pp. 246-253.
Lesser, "CCD backside coatings optimized for 200-300 nm observations", Proceedings of SPIE, 2000, vol. 4139, pp. 8-15.
Lesser, "Improving CCD Quantum Efficiency", SPIE, 1994, vol. 2198, pp. 782-791.
Levin et al., "Ultraviolet emissions quantified by rocket payloads", SPIE, 1992, vol. 1764, pp. 388-399.
Martin et al., "A turbulent wake as a tracer of 30,000 years of Mira's mass loss history", Letters, Nature, Aug. 16, 2007, vol. 448, pp. 780-783.
Nicastro et al., "Missing Baryons and the Warm-Hot Intergalactic Medium", Science, Jan. 4, 2008, vol. 319, pp. 55-57.
Nikzad et al., "Delta-Doped CCDs for Enhanced UV Performance", SPIE, 1994, vol. 2278, pp. 138-146.
Nikzad et al., "Delta-doped CCDs: High QE with long-term stability at UV and visible wavelengths", Proc. of SPIE, 1994, vol. 2198, pp. 907-915.
Nikzad et al., "Ultrastable and Uniform EUV and UV Detectors", Proceedings of SPIE, 2000, vol. 4139, pp. 250-258.
Peckerar, "Modeling UV response of rear-surface sensitized charge-coupled devices", Appl. Phys. Letter May 4, 1987, vol. 50, No. 18, pp. 1275-1277.
Porco et al., "Cassini Imaging of Jupiter's Atmosphere, Satellites, and Rings", Science, Mar. 7, 2003, vol. 299, pp. 1541-1547.
Porcoc et al., "Cassini Imaging Science: Instrument Characteristics and anticipated Scientific Investigations at Saturn", Space Science Reviews, 2004, vol. 115; pp. 363-497.
Robbins et al., "Chemical Etching of Silicon", J. Electrochem Sol, 1959, pp. 505-508.
Tsai et al., "Imaging of Caffeine-Inducible Release of Intracellular Calcium in Cultured Embryonic Mouse Telencephalic Neurons", Journal of Neurobiology, 1995, vol. 27, No. 2, pp. 252-265.
West et al., "Ultraviolet Photography: Bite marks on Human Skin and Suggested Technique for the Exposure and Development of Reflective Ultraviolet Photography", J. Forensic Sc., 1987, vol. 32, pp. 1204-1213.
Won et al., "Initial reaction of hafnium oxide deposited by remote plasma atomic layer deposition method", Applied Physics Letter, 2005, vol. 87, pp. 262901-1-262901-3.

* cited by examiner

ATOMICALLY PRECISE SURFACE ENGINEERING FOR PRODUCING IMAGERS

CROSS-REFERENCE TO RELATED APPLICATIONS

This application claims priority to U.S. Provisional Application No. 61/406,472, filed Oct. 25, 2010, the disclosure of which is incorporated herein by reference.

STATEMENT OF FEDERAL FUNDING

The invention described herein was made in the performance of work under a NASA contract, and is subject to the provisions of Public Law 96-517 (35 USC 202) in which the Contractor has elected to retain title."

FIELD OF THE INVENTION

This invention relates generally to a novel method of engineering atomically precise surface; and more particularly to a process for forming atomically precise coatings for use in producing high quality imagers.

BACKGROUND OF THE INVENTION

The ultraviolet represents an extremely important region of the electromagnetic spectrum as it has a critical role in a wide variety of scientific, commercial, and government applications. For example, ultraviolet spectroscopy can be utilized to study planetary atmospheres to determine whether basic elements for life such as oxygen, nitrogen, and hydrogen are present. (See, e.g., Barth, C. A., *Appl Optics* 8, 1295, doi: 10.1364/ ao.8.001295 (1969), the disclosure of which is incorporated herein by reference.) A UV spectrometer can also detect small quantities of complex organic molecules, (e.g., tholins), from the UV reflectivity of the surface of an icy moon providing information on how prebiotic chemistry takes place on extraterrestrial bodies. (See, e.g., Hendrix, A. R., et al., *Icarus* 206, 608-617, doi:10.1016/j.icarus.2009.11.007 (2010), the disclosure of which is incorporated herein by reference.) High sensitivity astronomical observations in the UV regime could also enable the observation of faint emission from the baryons that form the intergalactic medium, which likely represent 50% of the detectable baryonic mass in the universe. (See, e.g., Nicastro, F., et al., *Science* 319, 55-57, doi:DOI 10.1126/science.1151400 (2008), the disclosure of which is incorporated herein by reference.) Recent measurements enabled by the first all sky UV survey mission, GALEX, have uncovered a startling comet-like tail behind a red giant star that is streaking through space at nearly 300,000 miles per hour. This phenomenon is unique and can only be observed in the UV, and has now provided a means to characterize how stars can die and ultimately seed new solar systems through the shedding of carbon, oxygen, and other elements, (See, e.g., Martin, D. C. et al., *Nature* 448, 780-783, doi:10.1038/nature06003 (2007), the disclosure of which is incorporated herein by reference.) Extreme UV lithography is utilized to pattern the finest features of the latest generation of semiconductor devices. UV laser inspection and imaging is therefore critical to identify defects in the fabrication process to maximize yield and reduce cost in this highly competitive industry. (See, e.g., Chan, Y. D., et al. 76361D-76361D-76316, doi:10.1117/12.847371 (2010)UV, the disclosure of which is incorporated herein by reference.) UV imaging has also recently been used in medical imaging to study how caffeine affects calcium ionic pathways in the brain. (See, e.g., Tsai, T. D. & Barish, M. E., *J Neurobiol* 27, 252-265, doi:10.1002/neu.480270211 (1995), the disclosure of which is incorporated herein by reference.) Rockets produce significant UV emission due to the production of excited nitrogen oxide species in their plumes. (See, e.g., Levin, D. A., *Proceedings of the SPIE* 1764, 388-399, doi:10.1117/12.140868 (1993), the disclosure of which is incorporated herein by reference.) While infrared imaging is clearly an important anti-missile defense technology, UV can offer significant advantages even in this application due to the ability to observe even in direct sunlight using "solar-blind" imaging. Bite marks can be readily observed and identified in forensic investigations since human saliva (wet or dry) shines brightly under UV illumination. (See, e.g., West, M. H., et al., *J Forensic Sc* 32, 1204-1213 (1987), the disclosure of which is incorporated herein by reference.) Bruises are also evident for many days in UV after they have disappeared to the naked eye. As this only represents a small fraction of the real world applications of UV detectors, there is clearly strong motivation to have detectors with the highest possible sensitivity.

Unfortunately, despite this wide range of applications, scientific imaging in the ultraviolet is extremely difficult because the technology for sensing UV light is substantially limited by the quantum efficiency of available detectors and the transparency of optical coating materials. For example, many materials strongly absorb Near and Far UV light such that thicknesses of 20 nanometers or less are completely opaque. Thus, the UV throughput of an instrument is highly sensitive to impurities on, or contained in, any of the optical elements or the detector itself. The absorption depth of UV photons is also very short, making collection of photo-induced current difficult with traditional materials. Compounding this problem is that many important sources of UV light are faint, so maximizing detector sensitivity is critical to unlock the true potential of UV imaging for the above applications.

TABLE 1

Performance of UV Detectors in Major Space Missions.

| | Typical Quantum Efficiency (155-300 nm) | Example of Current Use in Astronomy |
|---|---|---|
| $Cs_2Te$ Microchannel Plates | ~10% or less | GALEX Space Telescope |
| Silicon CCD coated with Lumogen | ~15-25% or less | Cassini ISS, Hubble Space Telescope |

Table 1, above, outlines some information for two examples of ultraviolet sensitive detectors that are currently in use in space missions along with their typical quantum efficiencies in the near and far UV. (See, e.g., Joseph, C. L., 3764, 246-253, doi:10.1117/12.371088 (1999) & Porco, C. C. et al., *Space Science Reviews* 115, 363-497, doi:10.1007/s11214-004-1456-7 (2004), the disclosures of which are incorporated herein by reference.) Although new classes of III-Nitride materials based on MBE or MOCVD grown GaN or AlGaN hold significant promise for future generations of UV detectors, they are expensive and extremely difficult to grow at sufficient quality to fabricate into imagers with low dark current and high responsivity. Silicon based charge coupled devices (CCDs), however, are based on the same fabrication technologies utilized in the semiconductor industry and are heavily used in commercial imaging applications such as digital cameras. This makes silicon CCDs cheap to manufacture with the added benefit that pixel design and layout are both extremely flexible. CMOS (Complementary Metal Oxide Semiconductor) based imagers are also widespread, and their use in commercial and scientific applications has been accelerating over the last few years due to the rapid progress of the overall CMOS industry. Unfortunately, the native oxide that naturally forms on silicon causes unfavorable distortions in silicon's electronic band structure in the near surface region. This leads to the capture of UV produced photoelectrons in surface traps and thus very poor response below 300 nm for silicon imagers. (See, e.g., Hoenk, M. E. et al., *Appl Phys Lett* 61, 1084, doi:10.1063/1.107675 (1992), the disclosure of which is incorporated herein by reference.) This can be overcome though a combination of techniques known as back illumination and back surface passivation.

Commercial methods, such as chemisorption and ion implant/laser anneal, do exist to passivate the back surface of silicon CCDs. (See, e.g., Lesser, M. P., 4139, 8-15, doi: 10.1117/12.410521 (2000); Peckerar, M. C., et al., *Appl Phys Lett* 50, 1275, doi:10.1063/1.97882 (1987); & Lesser, M. P., 2198, 782-791, doi:10.1117/12.176777 (1994), the dislcosures of each of which are incorporated herein by reference.) However, there are limitations to these techniques in that they either 1: do not achieve 100% internal quantum efficiency, 2: have undesirably high dark current, or 3: are subject to hysteresis and stability issues due to adsorption of oxygen and other gases in the environment on the surface of the CCD. In contrast, surface passivation by delta-doping using silicon molecular beam epitaxy, enables precise control over the band structure at the CCD surface to get ideal Si reflection-limited response (see FIG. 1). (See, e.g., Burke, B. E. et al., 300, 41-50, doi:10.1007/1-4020-2527-0_6 (2004) & Nikzad, S., 2278, 138-146, doi:10.1117/12.180023 (1994), the disclosures of each of which are incorporated herein by reference.)

Even with ideal back surface passivation, the inherent reflectivity of silicon significantly limits the absolute detector quantum efficiency of silicon CCDs. This is illustrated by the dip in quantum efficiency to ~25% near 280 nm in FIG. 1, which shows the measured and absolute quantum efficiency for a back-illuminated, delta-doped silicon CCD. Note that the data, once corrected for quantum yield, lies along the silicon transmittance curve. This indicates that the CCD is exhibiting reflection-limited response and 100% internal quantum efficiency. Data for an unmodified, front-illuminated CCD is shown for comparison purposes to illustrate the improvement in UV sensitivity that is achieved by the delta-doping and back-illumination processes. Based on these results, anti-reflection (AR) coatings should be utilized to maximize imaging performance. Modeling results predict that absolute quantum efficiencies of >50% should be achievable from in the near and far UV (100 nm-300 nm). (See, e.g., Hamden, E., et al., *Appl Optics* (2011), the disclosure of which is incorporated herein by reference.)

It should be noted that anti-reflective (AR) coatings are widely utilized for many detector systems (silicon, III-V, etc.) in the visible and infrared to improve absolute quantum efficiency. However, producing UV anti-reflection coatings is extremely challenging as the coatings must be extremely high quality: low in impurity/defect concentration to avoid UV absorption, and pinhole free dense to prevent humidity interaction with the imager surface. In addition, the index of refraction of silicon varies significantly over the UV, and therefore multiple different materials are required to cover the Near and Far UV effectively. This is especially important because even ideal materials have absorption cut offs that make them opaque in certain regions of the UV. In addition, a change of 2 nm or less can dramatically shift the peak anti-reflection performance or lead to dramatic changes in absorption cutoffs, especially in the far UV, making controllable and reproducible fabrication of ultrahigh performance AR coated silicon CCDs difficult. Recent modeling results by Hamden et al. have demonstrated that the target thicknesses for UV anti-reflective coatings range from 10 to 25 nm. (See, e.g., Hamden, E., et al., cited above.) When all of these constraints are combined (back-illumination, silicon band structure engineering/surface passivation, and AR coating deposition with sub-nanometer precision and accuracy), a series of sequential robust, nanoscale, surface-engineering processes are required to produce the best possible UV sensitive CCDs. Accordingly, a need exists to develop high-quality coatings to improve the optical properties of UV imagers.

BRIEF SUMMARY OF THE INVENTION

Thus, there is provided in accordance with the current invention a process for forming imagers having atomically precise optical coatings formed thereon, and imagers formed in accordance with such process.

In one embodiment, the invention is directed to a method of forming atomically precise coatings for imagers including:
  providing an imager substrate having at least a first surface at one end thereof;
  placing the imager substrate under vacuum and preparing said surface for deposition;
  sequentially exposing the first surface to at least two precursors selected such that said at least two precursors react on the first surface to form at least one dielectric material, and repeating the sequential exposure until the at least one dielectric material forms a coating on at least a portion of the at least first surface, the coating configured to allow imaging across a selected spectral range; and
  wherein the coating has a density sufficient to ensure that the coating is atomically continuous across the substrate, and wherein the out-of-plane thickness of the coating is conformal to the at least first surface of the substrate on an atomic size scale.

In one such embodiment, the first surface is the backside surface of the imager, and the substrate further comprises a frontside surface disposed opposite the backside surface, and wherein the imager electronics are disposed on the frontside surface thereof.

In another such embodiment, the substrate is a silicon wafer.

In still another such embodiment, the method includes delta-doping the at least first surface of the imager substrate prior to depositing the dielectric material.

In yet another such embodiment, the dielectric material is selected from the group consisting of $Al_2O_3$, $TiO_2$, $SnO_2$, $MgO$, $ZnO$, $HfO_2$, $MgF_2$, and $SiO_2$.

In still yet another embodiment, the coating includes at least two layers of the at least one dielectric material.

In still yet another embodiment, the at least two layers are formed from different dielectric materials.

In still yet another embodiment, the at least one layer formed proximal to the substrate is sufficiently thin to be optically inactive and is formed of a dielectric material suitable to act as a barrier layer between the distal coating and the underlying substrate surface.

In still yet another embodiment, the barrier layer is formed of $Al_2O_3$ and at least a second distal layer is formed of $HfO_2$. In one such embodiment, the $Al_2O_3$ has a thickness of no greater than 3 nm.

In still yet another embodiment, the coating is configured to operate as an anti-reflective coating.

In still yet another embodiment, the dielectric material is selected such that the imager may operate in a spectral region of between 100 to 300 nm.

In still yet another embodiment, the imager is a charge-coupled device.

In still yet another embodiment, the imager has an absolute quantum efficiency above 50% for the selected spectral range.

In still yet another embodiment, between the preparation of the substrate surface and the dielectric coating process the imager substrate is not exposed to the external atmosphere.

In another embodiment the invention is directed to an imager including:
- an imager substrate having at least a first surface at one end thereof;
- an anti-reflective coating formed on at least a portion of the at least first surface, the coating formed of at least one dielectric material selected to allow imaging across a selected spectral range; and
- wherein the coating has a density sufficient to ensure that the coating is atomically continuous across the substrate, and wherein the out-of-plane thickness of the coating is conformal to the at least first surface of the substrate on an atomic size scale.

In one such embodiment, the first surface is the backside surface of the imager, and wherein the substrate further comprises a frontside surface disposed opposite the backside surface, and wherein the imager electronics are disposed on the frontside surface thereof.

In another such embodiment, the substrate is a silicon wafer.

In still another such embodiment, the imager includes delta-doping the at least first surface of the imager substrate prior to depositing the dielectric material.

In yet another such embodiment, the dielectric material is selected from the group consisting of $Al_2O_3$, $TiO_2$, $SnO_2$, MgO, ZnO, $HfO_2$, $MgF_2$, and $SiO_2$.

In still yet another such embodiment, the coating includes at least two layers of the at least one dielectric material.

In still yet another such embodiment, the at least two layers are formed from different dielectric materials.

In still yet another such embodiment, the at least one layer formed proximal to the substrate is sufficiently thin to be optically inactive and is formed of a dielectric material suitable to act as a barrier layer between the distal coating and the underlying substrate surface. In one such embodiment, the barrier layer is formed of $Al_2O_3$ and at least a second distal layer is formed of $HfO_2$. In another such embodiment, the $Al_2O_3$ has a thickness of no greater than 3 nm.

In still yet another embodiment, the dielectric material is selected such that the imager may operate in a spectral region of between 100 to 300 nm.

In still yet another embodiment, the imager is a charge-coupled device.

In still yet another embodiment, the imager has an absolute quantum efficiency above 50% for the selected spectral range.

In still yet another embodiment, the dielectric coating is formed without exposing said imager substrate to the external atmosphere.

BRIEF DESCRIPTION OF THE DRAWINGS

The description will be more fully understood with reference to the following figures and data graphs, which are presented as exemplary embodiments of the invention and should not be construed as a complete recitation of the scope of the invention, wherein.

DETAILED DESCRIPTION OF THE INVENTION

The current invention is directed to high-quality surface coatings, and techniques combining the atomic precision of molecular beam epitaxy and atomic layer deposition, to fabricate high-quality surface coatings. The coatings of the instant invention, made in accordance with the techniques set forth by the invention are shown to be capable of forming silicon CCD detectors that demonstrate world record detector quantum efficiency (>50%) in the near and far ultraviolet (155 nm-300 nm). This invention describes the unique surface engineering approaches used and demonstrates the robustness of detector performance that is obtained by achieving atomic level precision at all steps in the coating fabrication process. As proof of concept, the characterization, materials, and exemplary devices produced in accordance with this invention are presented along with a comparison to other approaches.

Atomic Layer Deposition (ALD) is a thin film deposition technique similar to Chemical Vapor Deposition (CVD), where a desired film is grown using sequential surface reactions, one monolayer at a time. The ALD method enables growth of smooth, dense, pin-hole free films with angstrom level thickness control over arbitrarily large surface areas. In particular, in embodiments in accordance with the current invention this layer-by-layer growth allows for the precisely tailoring of the interface between the imager where the photons are adsorbed and the anti-reflection coating such that the coating surface is both dense and smooth, where:

Dense, for the purposes of this invention means that the atoms of the coating surface are packed together tightly enough that there are no pinholes or discontinuities in the surface, i.e., that the coating is continuous across the substrate on an atomic scale; and Smooth, for the purposes of this invention means that the atoms are deposited with such out-of-plane precision that the coating conforms to the underlying substrate on an atomic scale.

These features are important because this precise tailoring is critical as the MBE grown delta-layer is located <2 nm from the surface of the imager, and any reaction at the interface with the AR coating (i.e., the chemical reactions that might cause the formation of $HfSiO_4$) disrupts the underlying device performance.

Accordingly, in some embodiments of the invention the inventive coating technique involves processes including: selecting a material appropriate for the spectral range of interest, obtaining a substrate for coating, coating the substrate with the coating material using a atomic layer deposition technique without exposing the underlying substrate to the atmosphere. Exemplary embodiments of the coating method, and a schematic of a coating substrate interface in accordance with the invention are shown in the flow-chart provided in FIGS. 2a and 2b.

Figure 1:
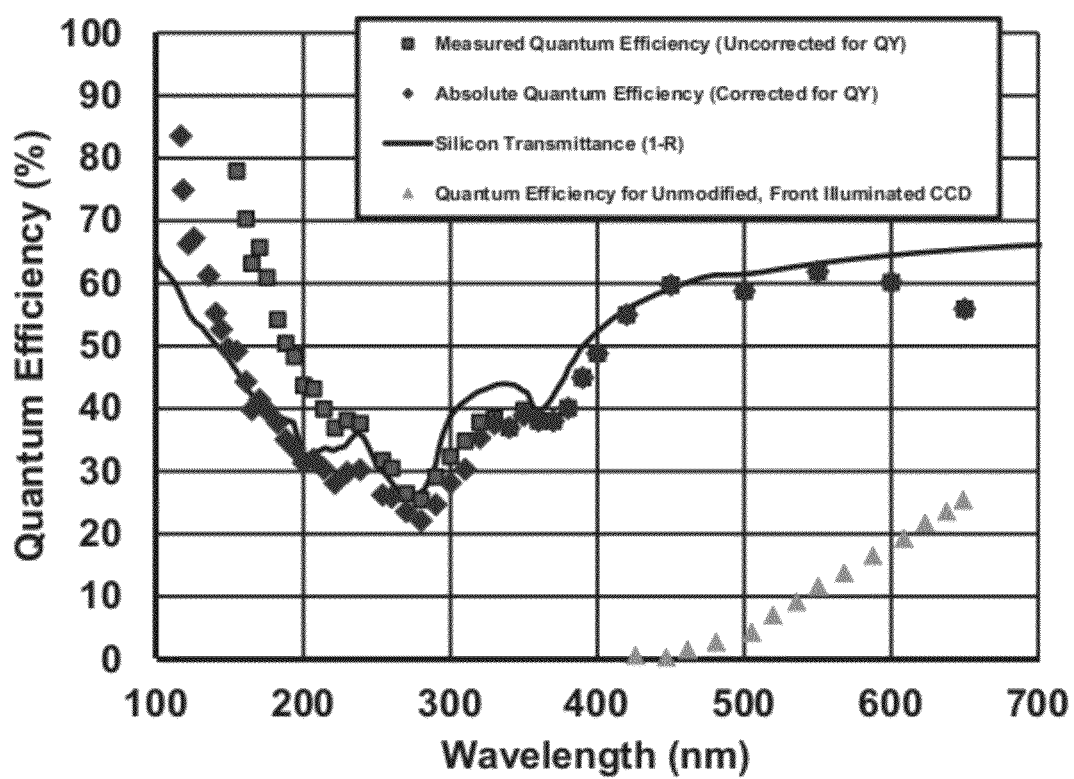
FIG. 1 provides a data plot showing the measured and absolute quantum efficiency for a back-illuminated, delta-doped (DD) silicon CCD in accordance with the current invention.
Figure 2A:
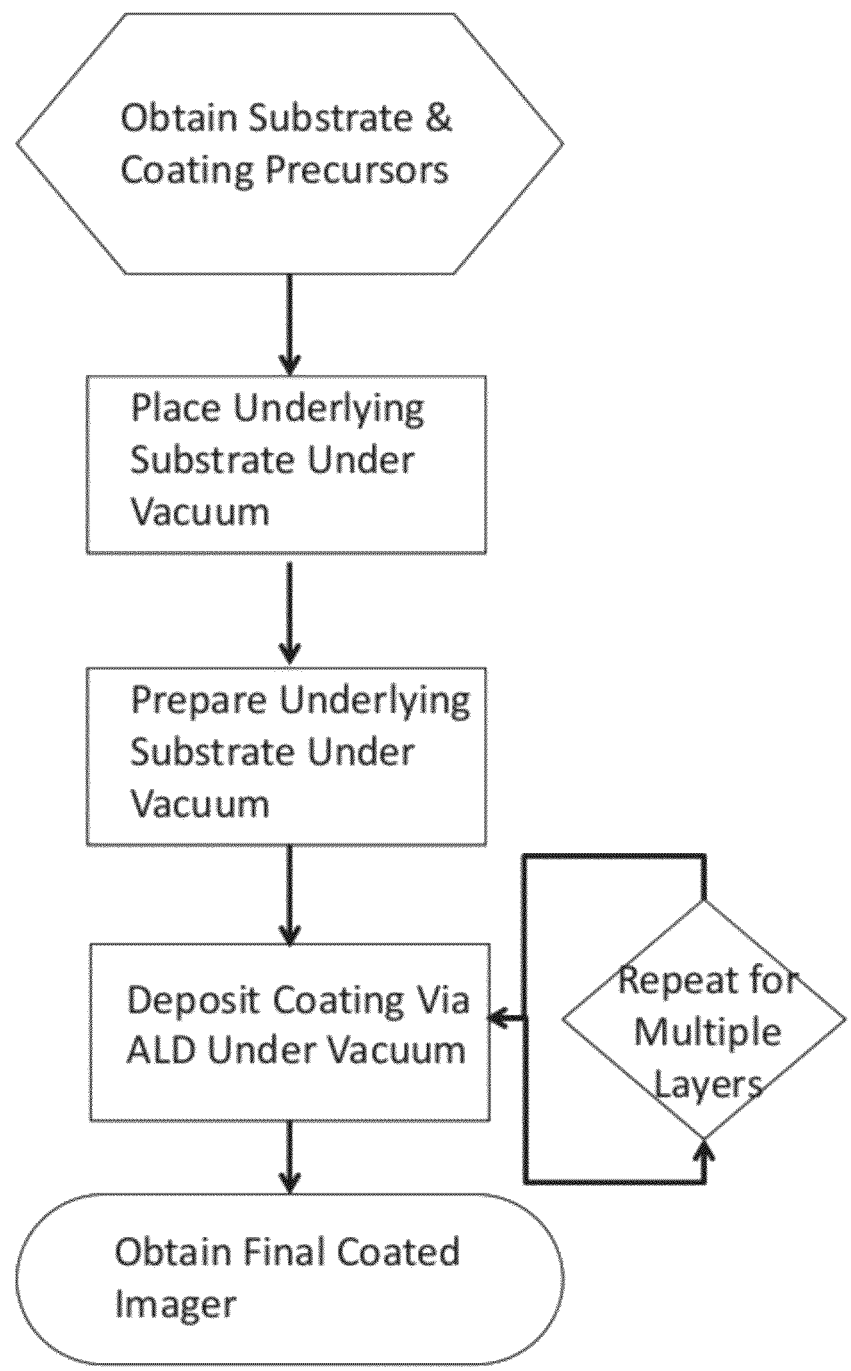
FIG. 2a provides a flow-chart showing a process for forming engineered coatings in accordance with embodiments of the current invention.
Figure 2B:
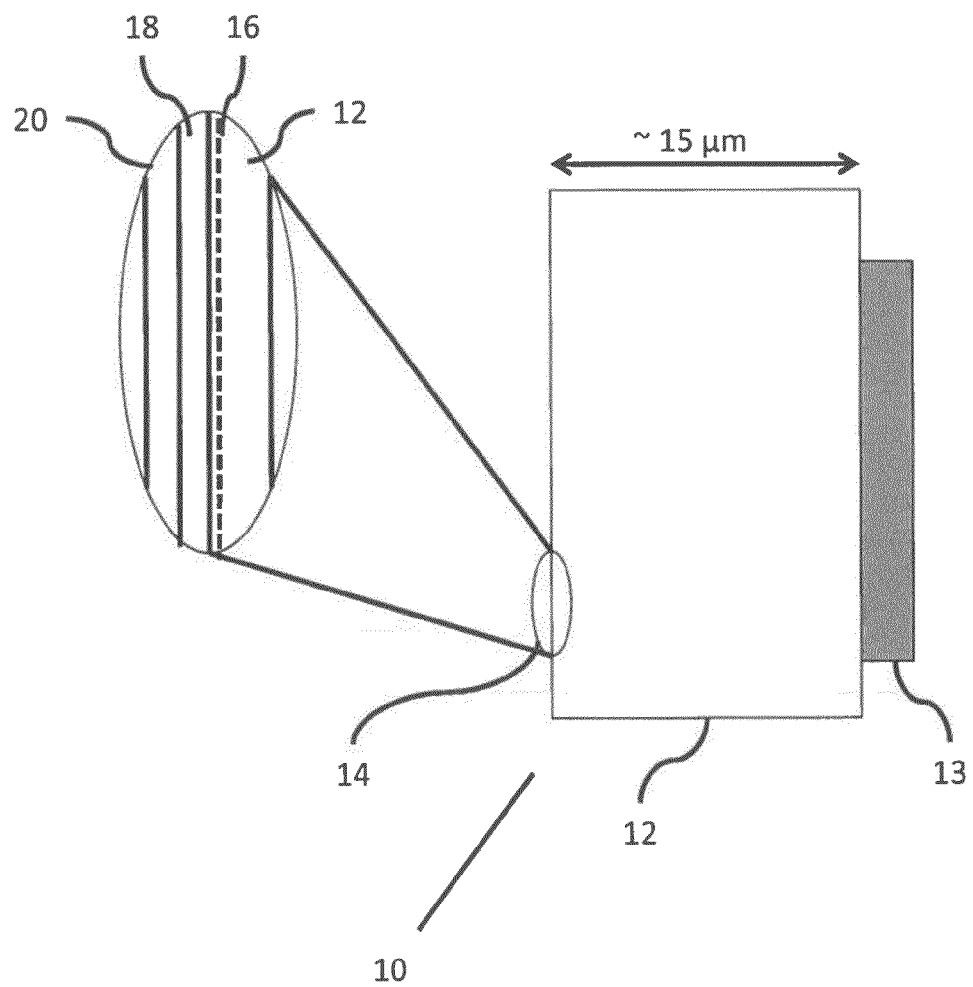
FIG. 2b provides a schematic of a DD-CCD with an AR coating in accordance with an embodiment of the current invention.

As shown in the schematic of FIG. 2b, in one embodiment the coating is formed on an imager (10) formed from a substrate (12), such as a silicon wafer. In an imager the silicon substrate would include electronics and circuitry on the frontside (13), and on the backside (14) a multilayer structure suitable for the particular imager. In the embodiment shown in this schematic a delta doped imager is considered. In such an embodiment, the backside surface of the substrate (12) is delta-doped (16) with an appropriate material, and then the AR coating (20) is applied. Between the delta-doping and the AR coating may lie one or more additional layers (18) including passivating layers and native oxide layers. Although this structure is provided as an example for further discussion, it should be understood that various alternative embodiments might be used, including different substrates, passivating layers and multiple AR layers. In addition, although a delta-doped imager is considered in this embodiment, the use of delta-doping is not required.

As shown in the flow chart of FIG. 2a, the process includes in these exemplary embodiments the process includes providing one or more suitable substrates, and then selecting one or more coating materials appropriate for the spectral ranges of interest. As will be described in greater detail in the Example section below, exemplary ALD $Al_2O_3$ and $HfO_2$ single and double layer antireflective coatings on delta-doped silicon substrates have been demonstrated, and are shown to have >50% QE over a wide range of UV wavelengths. However, it should be understood that this same approach using different chemical precursors suitable for deposition of $MgF_2$, $SiO_2$, MgO and other dielectrics, as is known in the art, enables the antireflection coatings and coating technique of the instant invention to cover the entire 100-300 spectral range with a 50-70% QE and potentially improving the current UV QE by nearly an order of magnitude (as a comparison, state-of-the-art GALEX detectors have a QE of about 5-10%). Indeed, ALD can be used to deposit several types of thin films, including various oxides (e.g. $Al_2O_3$, $TiO_2$, $SnO_2$, ZnO, $HfO_2$), metal nitrides (e.g. TiN, TaN, WN, NbN), metals (e.g. Ru, Ir, Pt), and metal sulfides (e.g. ZnS).

Once the substrate and coating materials are selected, the coatings are applied directly to the surface of the substrate, such as, for example, a delta-doped CCD via an ALD process. As described briefly above, Atomic Layer Deposition (ALD) is a thin film deposition technique that is based on the sequential use of a gas phase chemical process. The majority of ALD reactions use two chemicals, typically called precursors. These precursors react with a surface one-at-a-time in a sequential manner. By exposing the precursors to the growth surface repeatedly, a thin film is deposited. ALD is a self-limiting (the amount of film material deposited in each reaction cycle is constant) sequential surface chemistry that deposits conformal thin-films of materials onto substrates of varying compositions. ALD is similar in chemistry to chemical vapor deposition (CVD), except that the ALD reaction breaks the CVD reaction into two half-reactions, keeping the precursor materials separate during the reaction. Due to the characteristics of self-limiting and surface reactions, ALD film growth makes atomic scale deposition control possible. (See, e.g., V. B. Aleskovskii, *J. Appl. Chem. USSR.* 47, 2207, (1974), the disclosure of which is incorporated herein by reference.) By keeping the precursors separate throughout the coating process, atomic layer control of film growth can be obtained as fine as ~0.1 Å (10 pm) per cycle. Separation of the precursors is accomplished by pulsing a purge gas (typically nitrogen or argon) after each precursor pulse to remove excess precursor from the process chamber and prevent 'parasitic' CVD deposition on the substrate.

In short, the growth of material layers by ALD consists of repeating the following characteristic four steps:
1. Exposure of the first precursor.
2. Purge or evacuation of the reaction chamber to remove the non-reacted precursors and the gaseous reaction by-products.
3. Exposure of the second precursor—or another treatment to activate the surface again for the reaction of the first precursor.
4. Purge or evacuation of the reaction chamber.

Each reaction cycle adds a given amount of material to the surface, referred to as the growth per cycle. To grow a material layer, reaction cycles are repeated as many as required for the desired film thickness. One cycle may take time from 0.5 s to a few seconds and deposit between 0.1 and 3 Å of film thickness. Before starting the ALD process, the surface is stabilized to a known, controlled state, usually by a heat treatment. Due to the self-terminating reactions, ALD is a surface-controlled process, where process parameters other than the precursors, substrate, and temperature have little or no influence, and, because of the surface control, ALD-grown films are extremely conformal and uniform in thickness. These thin films can also be used in correlation with other common fabrication methods, such as molecular beam epitaxy (MBE), etc.

As can be appreciated from the above discussion, using ALD film thickness depends only on the number of reaction cycles, which makes the thickness control accurate and simple. Unlike CVD, there is less need of reactant flux homogeneity, which gives large area (large batch and easy scale-up) capability, excellent conformality and reproducibility, and simplifies the use of solid precursors. Also, the growth of different multilayer structures is straight-forward. These advantages make the ALD method attractive for AR coatings, because it is possible by varying the thickness of the layer to ensure optimal QE, and multi-layer structures rather than single layer structures can be produced, which are capable of passivating the underlying substrate surface and prepare a better surface for growth of the AR coating itself. Accordingly, although a single layer AR coating structure is shown in FIG. 2b, it should be understood that the coatings of the instant invention may be of variable thickness, and may comprise any arbitrary number of different ALD deposited layers. In such an embodiment, the process described above would be repeated with different precursors to introduce additional layers, such as, for example, barrier layers between the underlying substrate and the AR coating to improve optical or surface properties.

Other advantages of ALD are the wide range of film materials available (as described above), high density and low impurity level. Also, lower deposition temperature can be used in order not to affect sensitive devices. However, conventional techniques for applying these coatings have been found to be inadequate to obtain truly high-quality coatings. In particular, conventional methods apply coatings to a substrate after the substrate has been exposed to room air for an uncontrolled period of time. In the current invention, has been discovered that the reproducibility and quality of these coatings and the critical interface between the AR coating and the imager substrate can be dramatically improved by applying the AR coating to the imager substrate immediately after the imager substrate has been prepared, such as directly after the delta-doping process has been completed with no break in the atmosphere in-between. This closed-system process avoids the formation of native oxides and the adsorption of any adventious carbon from the air, which results in the additional freedom in designing and optimizing the substrate/coating interface.

Exemplary Embodiments

The person skilled in the art will recognize that additional embodiments according to the invention are contemplated as being within the scope of the foregoing generic disclosure, and no disclaimer is in any way intended by the foregoing, non-limiting examples.

Methods & Materials

For the following examples wafers of Si CCD detectors were diced into "raft" sections with 12 die per raft. These were thinned using standard wet processing techniques to produce frame supported Si membranes for each die. These membranes were cleaned to remove surface contamination and oxides, and were subsequently delta-doped by MBE. The completed raft is then processed in an Atomic Layer Deposition system to apply the desired AR coating or coatings. The coated region was then verified to have the desired QE by testing the device in a vacuum UV test stand.

Wafers containing fully fabricated CCDs of two types were acquired for this investigation from multiple commercial sources. These included 1) flight spare CCD wafers, manufactured by Loral, for the imagers in the Cassini spacecraft mission that is currently flying in the Saturn system (Porco, C. C., *Science* 299, 1541-1547, doi:10.1126/science.1079462 (2003), the disclosure of which is incorporated herein by reference), 2) wafers containing newly designed electron-multiplied CCDs (EM-CCDs) from e2v. These EM-CCDs combine the high ultraviolet quantum efficiency of silicon imagers with a gain register which results in measurements with extremely high signal to noise ratio (as high as 10,000:1), enabling them to be utilized in photon counting applications. These three different types CCDs were utilized to demonstrate the robustness of the techniques in this investigation and show that this is a generally applicable approach to enhance the UV quantum efficiency of any type of silicon imager.

Figure 3:
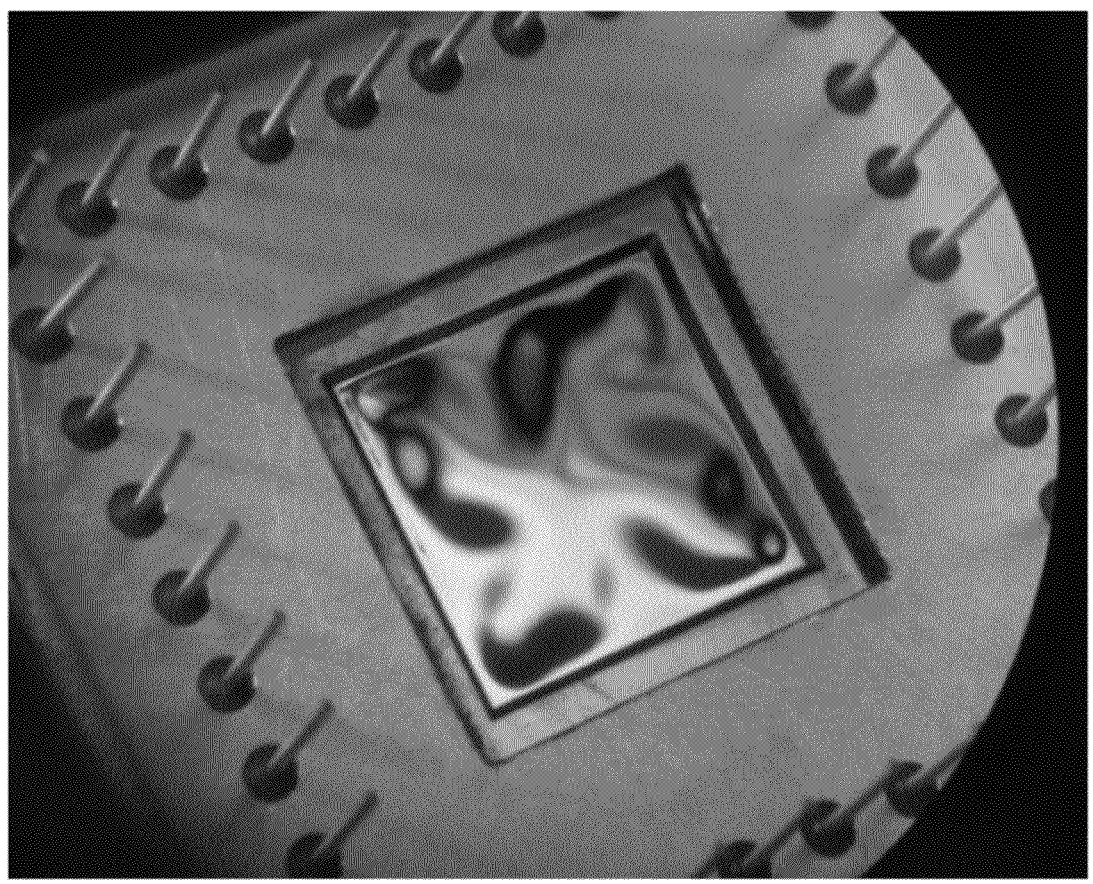
FIG. 3 provides an image of a CCD formed in accordance with the current invention, in this image a Cassini CCD that has been frame thinned to enable back is shown, its frontside detection electronics are face down as pictured, and a picture frame package with a window is cut to enable the backside illumination.

The CCDs were set up for back-illumination to remove the frontside circuitry from the photon pathway. The bulk thickness of the CCDs was reduced by polishing and chemical etching to leave a thin membrane. The final thickness of the membrane after this process is thick enough so that it has sufficient mechanical strength to withstand its environment. The membrane is also thin enough so that charge carriers produced at the back surface do not drift too far laterally as they are swept to their destination pixel on the frontside. This maps the point of photon impact to a specific frontside pixel in the image. CCDs are produced with an epitaxial layer that provides a natural definition for the membrane thickness. It is uniform across the entire CCD and provides a chemical etch-stop for the thinning process. For this work, the membrane is created in a way that makes it monolithic with a thick frame of original silicon from the CCD. In fact, the frontside CCD circuitry resides, in continuity, over regions that are thick frame and thin membrane. The thick frame serves the purpose of mechanically supporting the membrane and it makes it convenient to wire bond the imaging device using its existing bond pads. It should be noted that residual stresses in the imaging membrane result in macroscale deformations when the frame thinning approach is used (see FIG. 3, which shows a clover leaf pattern that is evidence of compressive stresses present in the processed silicon). However, this frame thinning approach is a relatively easy and inexpensive way to back-illuminate a silicon CCD, and therefore is ideal for proof of concept demonstrations. Backside illumination processes where the entire CCD is thinned are currently commercially available, but these fabrication processes are not compatible with the MBE and ALD techniques of this invention. An alternative approach where the entire CCD is thinned that is compatible with MBE and ALD may be used with the current invention. This approach eliminates the deformation and is appropriate for high volume production of scientific grade CCDs In the frame thinning approach, the backside of the CCD wafer is polished by chemical mechanical polishing (CMP) and the membrane region is defined by a nitride mask on the polished surface. The bulk silicon is aggressively etched by hot 55% KOH except for the frame defined by the nitride mask. The progress of the etch is monitored and terminated when it comes within 20 microns of the known epitaxial layer thickness. The surface texture of the KOH etch is rough by comparison to the CMP surface. This condition is rectified by the next step, which is etching in a specific mixture of hydrofluoric, nitric and acetic acids (HNA). The expression for relative volume in the mixture is 1:3:8. This mixture of HNA continues the etch to the epitaxial layer where it self-terminates upon exhaustion of bulk silicon. The chemical reason for the well defined etch stop comes from the higher resistivity of the epitaxial layer. The epitaxial layer has many orders of magnitude fewer charge carriers on hand for participation in the chemical reaction of the etch. The etch reaction stops as it is starved for charge carriers. (See, e.g., Robbins, H. & Schwartz, B., *J Electrochem Soc* 106, 505, doi:10.1149/1.2427397 (1959), the disclosure of which is incorporated herein by reference.) Additional brief etch exposures are made to mixtures of 1:40:15 HNA and $KMnO_4$/HF. These solutions help to remove certain stains and haze, which are left by the previous reactions. The resulting thin membrane has a smooth mirror-like specular finish.

To prepare the CCDs for electrical passivation and band structure engineering, they are brought into an inert and clean glove box environment. A UV ozone clean is utilized to remove adventitious carbon and other organics, and a HF-ethanol spin clean is utilized to remove the native oxide from the imaging membrane. The backside surface of the imager is then passivated by delta-doping. (See, e.g., Nikzad, S., 4139, 250-258, doi:10.1117/12.410541 (2000) & Nikzad, S., Proceedings of the SPIE 2198, 907-915, doi:10.1117/12.176733 (1994), the disclosures of which are incorporated herein by reference.) Briefly, in delta-doping, an extremely thin silicon layer is grown epitaxially using a low temperature (<450° C.) molecular beam epitaxy process. This silicon epi grown layer is delta-doped during the growth process by incorporating a third of a monolayer of boron atoms, effectively as a single atomically thin sheet that does not interrupt the overall silicon epitaxy, but dramatically affects the electronic band structure of the silicon in the near surface region. This sheet of negative charge counteracts the potential well that typically forms at the surface due to the presence of silicon's native oxide, allowing the efficient collection of UV produced photoelectrons. This delta-layer enables the CCD to operate at 100% internal quantum efficiency (QE), limited only by reflection of light from the silicon surface.

Figure 4:
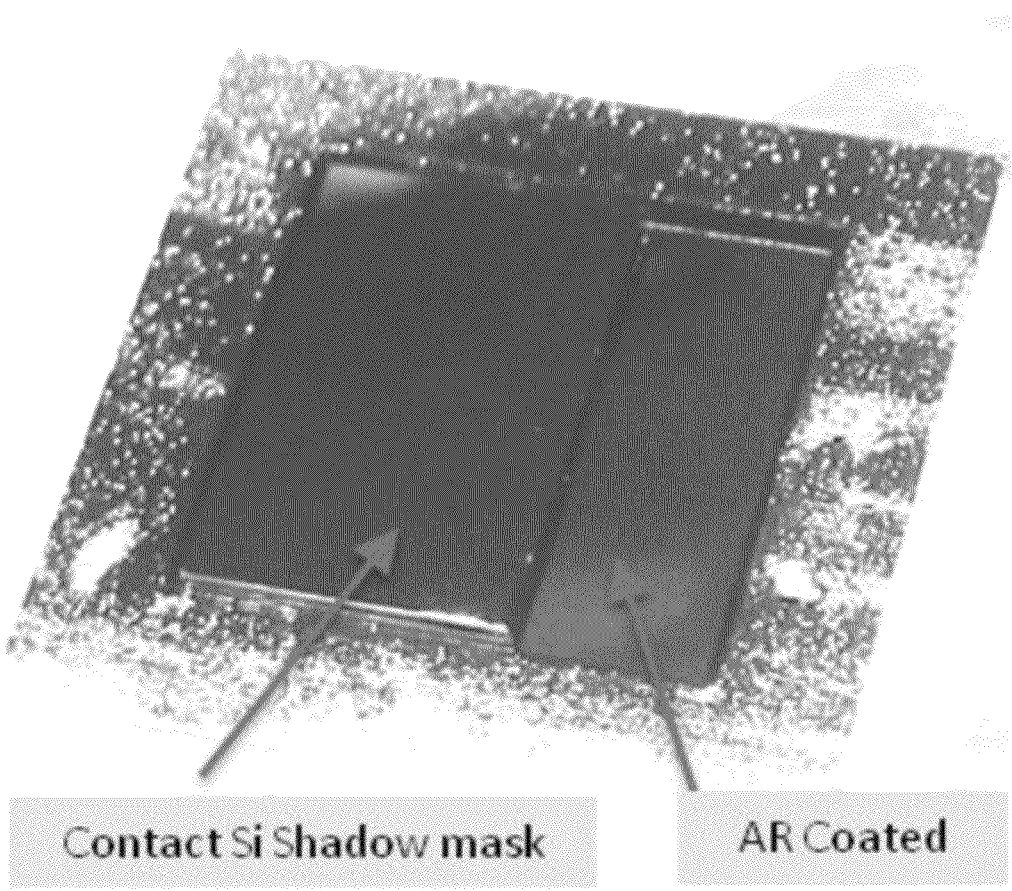
FIG. 4 provides an image of a shadow masking process used to form coatings in accordance with the current invention.

Anti-reflection (AR) coatings were tested to improve the imaging performance of these silicon CCDs. However, the index of refraction of the silicon changes significantly in the ultraviolet region of the spectrum, especially from 100 to 300 nm. Therefore, to obtain optimum quantum efficiency, it was necessary to test multiple different thin film coatings and coating methods. Contact shadow masks such as the one shown in FIG. 4 were utilized to ensure that all AR coated CCDs had an internal, uncoated standard for comparison to validate subsequent measurements of QE. In this case a diced silicon wafer was placed in direct contact with the thin imaging membrane to block the deposition of the AR coating from a portion of the device. This shadow masking is used to ensure that coated and uncoated references were present within the same device. The following thin film coating techniques were evaluated in this study: physical sputtering, electron beam evaporation, thermal evaporation, and atomic layer deposition.

Once the AR coatings were applied to the CCDs, they were packaged for testing in a custom built UV-Visible CCD characterization system described elsewhere. (See, e.g., Jacquot, B. C. et al. Rev Sci Instrum (2011 in review), the disclosure of which is incorporated herein by reference.) Briefly, imaging performance of the CCD was characterized from 121.6 nm to 650 nm starting from the longer wavelength end of the spectrum by taking flat field images over controlled exposure times. Two separate light sources were used for illumination (Deuterium lamp at FUV and Tungsten-Halogen for NUV). Absolute QE measurement was made by comparison to a NIST calibrated photodiode that could be positioned in the same location as the CCD being characterized. For the purposes of this invention, absolute quantum efficiency is defined as the probability of a photon incident at the detector surface will generate an electron that is detected by the detector element. This is to be distinguished from internal quantum efficiency, which subtracts out reflection losses, and only considers those photons, which have the opportunity to be absorbed by the detector. Note that single photons at very short wavelengths can produce more than one electron when they are absorbed by a silicon detector. (See, e.g., Jacquot, B. C. et al., Rev Sci Instrum (2011), the disclosure of which is incorporated herein by reference.) Therefore, calculations of absolute quantum efficiency need to be corrected for this gain factor, taking into account that the quantum yield those photons is greater than unity.

Background Comparison of Optical Properties of Various Coating Techniques

As discussed in the background, scientific grade silicon CCD detectors offer substantial improvements in performance for detection of photons in the ultraviolet (100-300 nm) range of the electromagnetic spectrum. In particular, back-illuminated CCDs that have been passivated using delta-doping technology (see, e.g., U.S. Pat. Nos. 5,376,810; 6,278,119; 6,403,963; 6,346,700; 7,786,421; and 7,800,040; U.S. Patent Publication No. 2011/0140246A1; and U.S. application Ser. Nos. 13/160,534 and 13/167,677, the disclosures of each of which are incorporated herein by reference) have at least 30% quantum efficiency over that entire range, compared to the ~5-10% achieved by microchannel plates that have been previously flown in space missions such as Galex. However, the performance of these delta-doped CCDs is limited due to the inherent reflectivity of the silicon itself. Anti-reflection coatings can, in principle, be applied to the silicon detector to improve the performance (up to QE's as high as 70%). However, the interface and film quality is critical for this theoretical performance to be achieved. Conventional sputtering and thermal evaporation techniques can be used to deposit films such as $HfO_2$, $MgF_2$, and MgO that should be anti-reflection coatings. However, recent experiments with these processes show that the film and interface quality achieved by these techniques are insufficient to achieve the desired QE. As ultraviolet imaging systems have the potential to detect life on other planets, explain the origins of the universe, identify defects in the latest generation of semiconductor devices, perform medical imaging and brain mapping, improve missile defense, and even solve crimes, this new approach to UV detector fabrication may have an important impact on a wide range of fields.

Thinned, Delta-Doped Cassini were utilized to evaluate thin film AR coating techniques and materials for their ability to improve absolute detector quantum efficiency. Magnesium oxide and hafnium oxide were deposited by physical sputtering. Hafnium oxide AR coatings were also deposited by electron beam evaporation and thermal evaporation. Lastly, hafnium oxide and aluminum oxide were deposited by atomic layer deposition. This combination of materials and deposition methods was chosen to elucidate the efficacy of each deposition technique within the constraints of the limited number of CCDs available for the experiments. Examples of flat field images obtained from some of the partially AR coated CCDs produced in this investigation are shown in FIG. 5.

Figure 5:
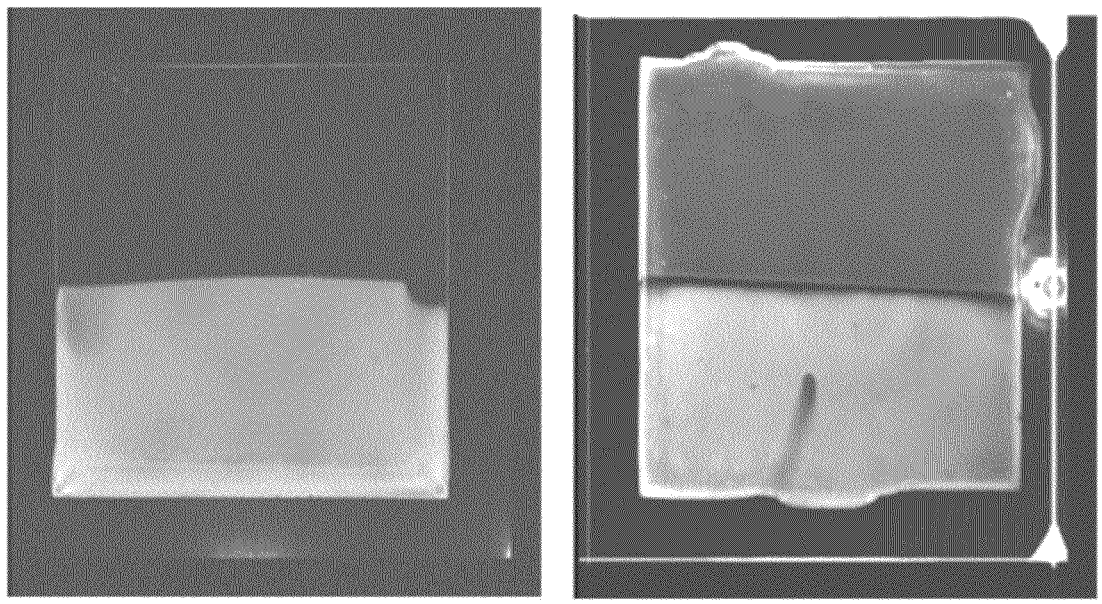
FIG. 5 provides a flat field image of a delta-doped back-illuminated silicon CCD in accordance with the current invention.

In particular, FIG. 5 shows flat field images taken by two partially AR coated Cassini CCDs under 300 nm UV illumination. The darker regions were sputter coated with magnesium oxide (MgO at left) and hafnium oxide ($HfO_2$ at right) respectively, while the brighter regions were protected by the shadow mask. The relative performance of the coated and uncoated regions was counter to expectations as the brightness of these flat field images is directly related to the absolute quantum efficiency of the detector. As mentioned earlier, the short wavelength flat field brightness is enhanced because the quantum yield is greater than one, but in all cases a brighter image indicates greater sensitivity.

Figure 6A:
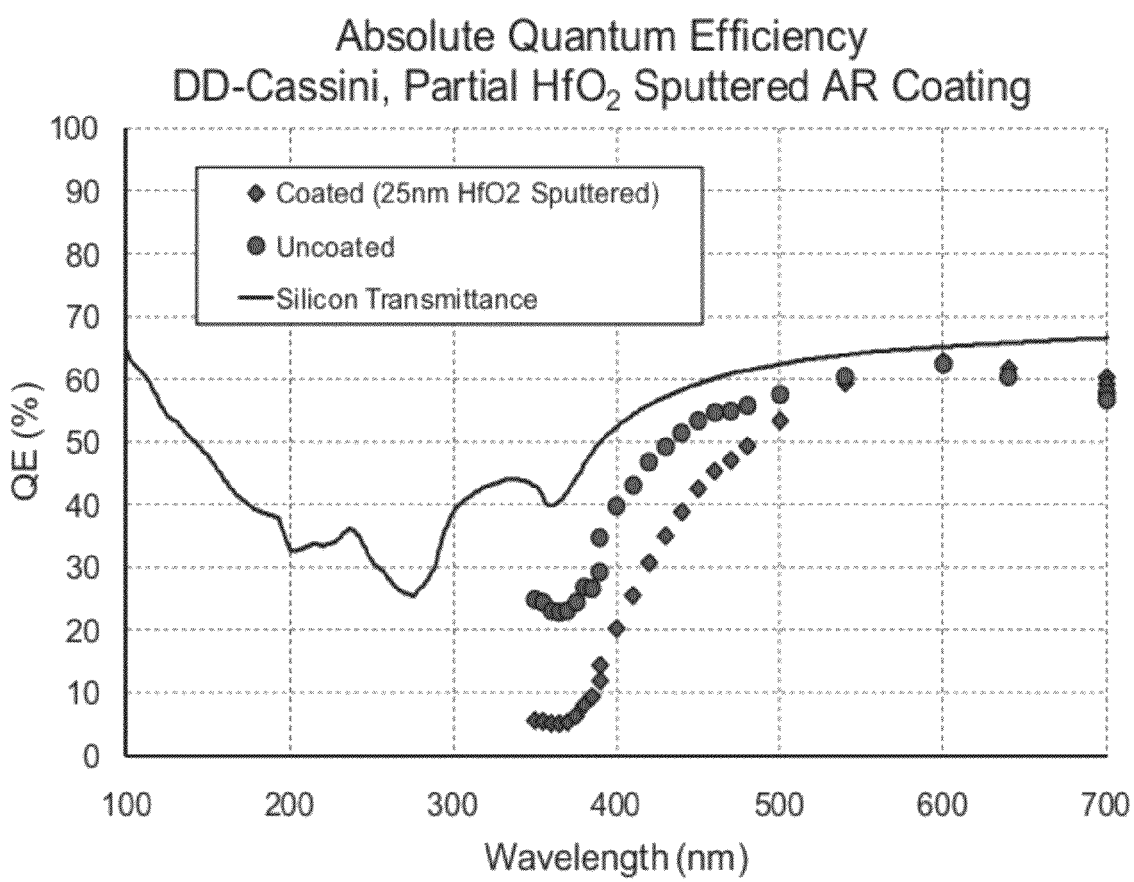
FIGS. 6a & 6b provide data plots for the absolute quantum efficiency for coated and uncoated sides of DD-CCDs in accordance with the current invention.
Figure 6B:
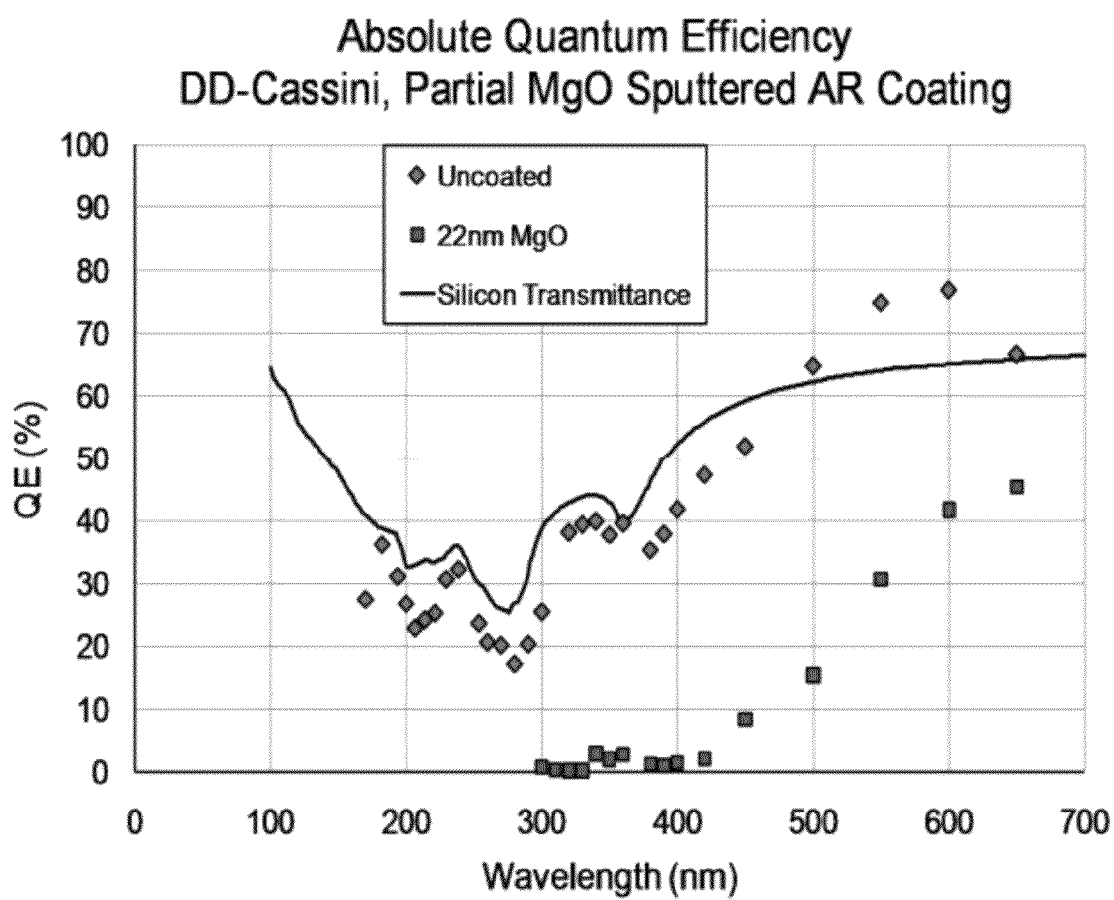

FIGS. 6a & 6b show plots of the quantum efficiency of these two CCDs over a range of wavelengths. The performance of the MgO coating (6b) was poor over the entire range of wavelengths. The HfO$_2$ coating (6a) was roughly identical to the uncoated side in the range of visible wavelengths, but substantially dropped off in the ultraviolet.

Figure 7:
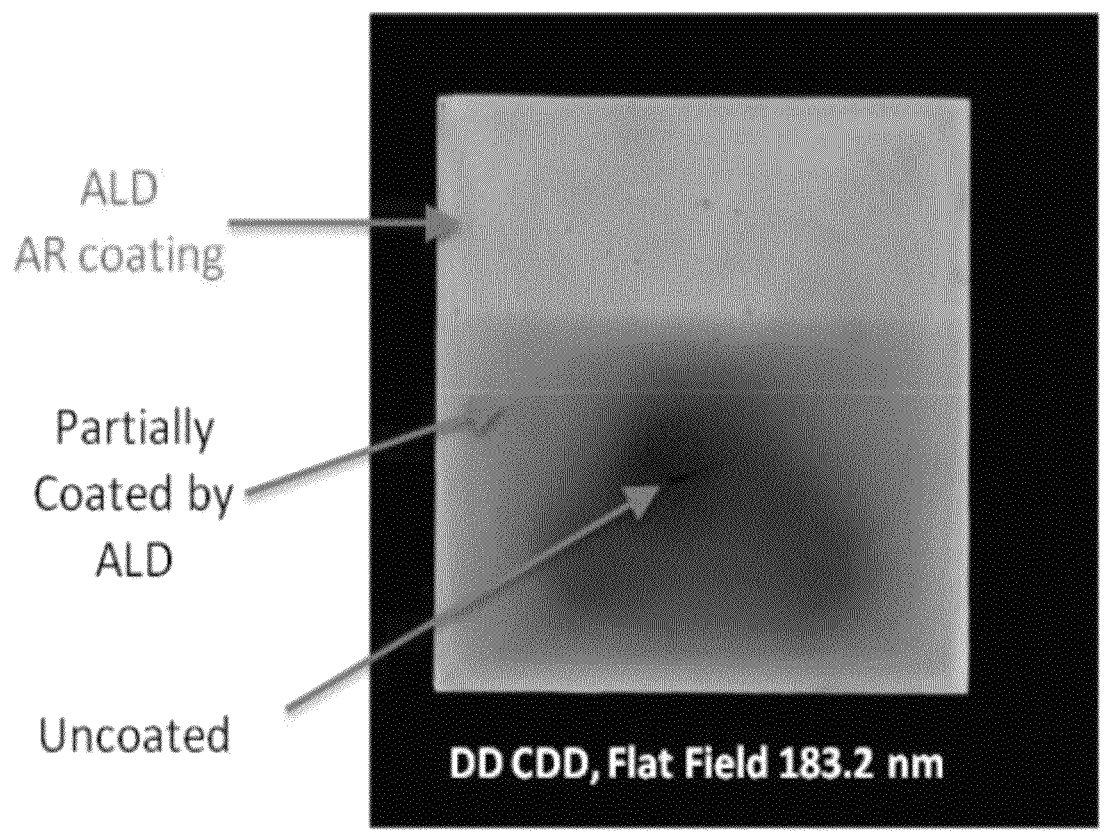
FIG. 7 provides a flat field image produced by delta-doped AR coated back illuminated silicon CCD in accordance with the current invention.

FIG. 7 shows the 183.2 nm flat field of a Cassini CCD partially AR coated with aluminum oxide by plasma enhanced atomic layer deposition (PEALD). The demarcation between the brighter, AR coated region at the top, and the uncoated region at the bottom is blurred compared to the flat field images obtained for AR coatings applied using sputtering, e-beam evaporation, and thermal evaporation techniques. This is due to the highly conformal nature of the ALD process. The contact shadow masking technique (shown in FIG. 4) has limitations due to the compressive stresses present in the thin silicon membrane. The raised clover-leaf pattern in the membrane (shown in FIG. 3) causes the shadow mask to be elevated above a certain portion of the imaging surface. That allows the ALD process to partially coat the shadowed regions because the ALD precursors can penetrate under the mask. However, this is not a concern for the real world applicability of these techniques. It is noted here again that the purpose of the shadow mask is only to provide an internal standard for an uncoated delta-doped CCD. The ultimate applications for these UV AR Coatings would require uniform blanket coatings over an entire CCD, eliminating the shadow masking requirement.

Figure 8:
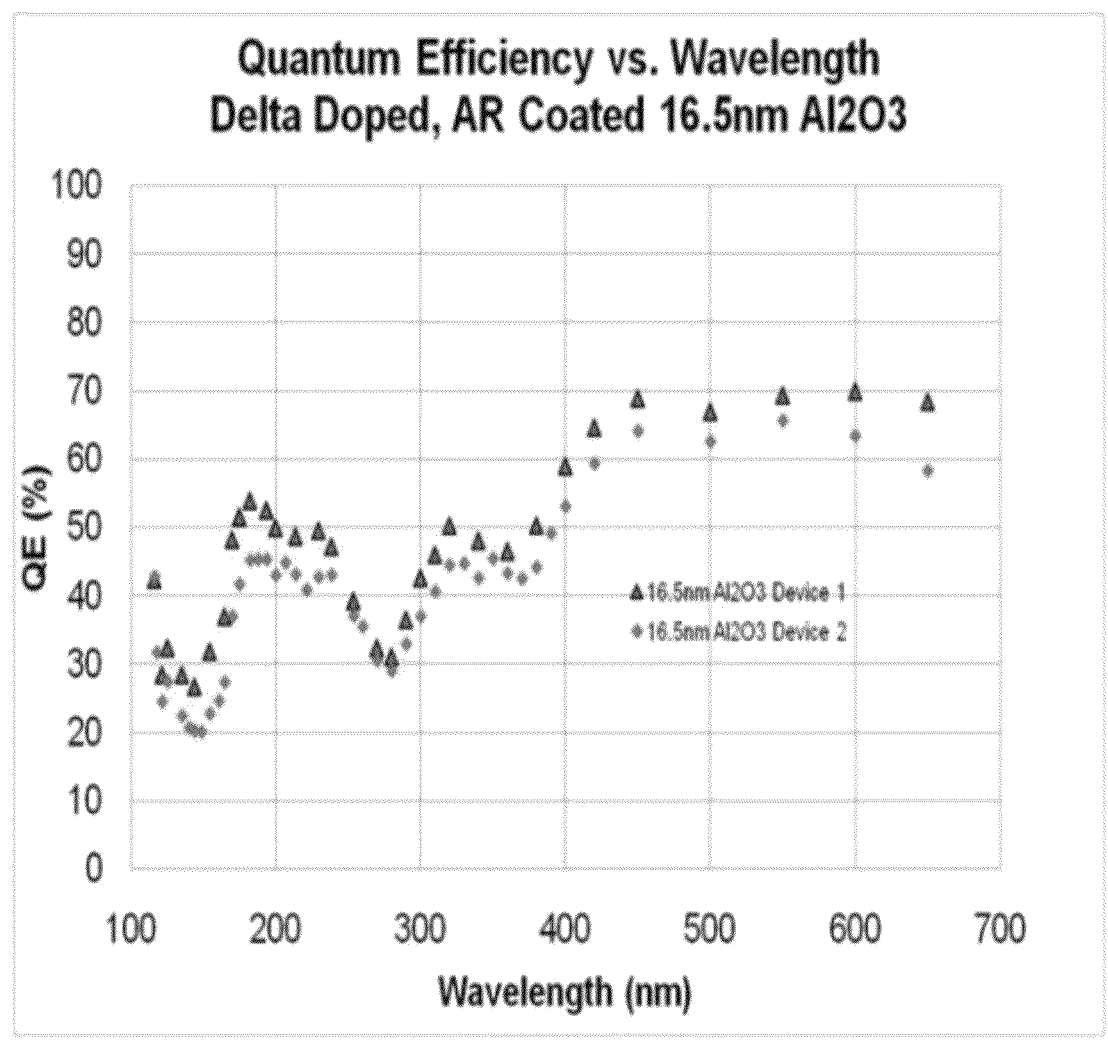
FIG. 8 provides data plots showing the quantum efficiency vs. wavelength for DD-CCDs in accordance with the current invention.

The design and accurate prediction of the performance of ALD AR coatings was straightforward due to the inherent reproducibility and control of the ALD technique. FIG. 8 shows the performance of a conventional and EM-CCD coated with a 16.5 nm AR coating of aluminum oxide. Their measured quantum efficiency is the same both qualitatively and quantitatively over the entire wavelength range tested despite there being a month between deposition runs. The modeled performance of the coatings also matches the measured data extremely well

EXAMPLE 1

Comparison Thermal Evaporation Coating and ALD Coating

Figure 9:
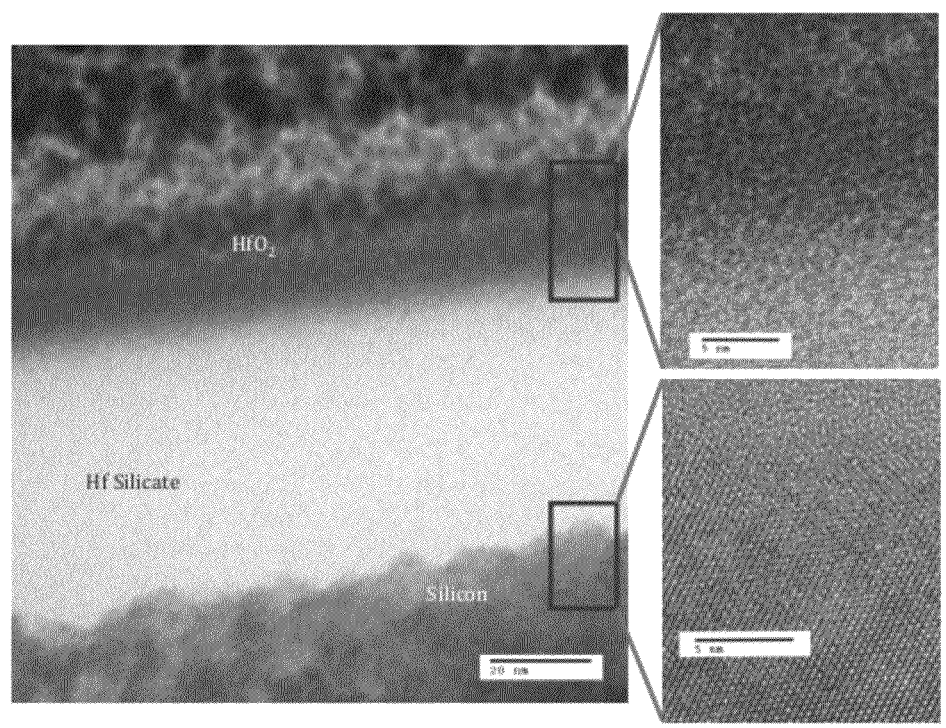
FIG. 9 provides a TEM images of PEALD $HfO_2$ grown on a DD silicon wafer.

Since remote plasma ALD of hafnium oxide on hydrogen terminated silicon is known to lead to the formation of a hafnium silicate interfacial layer, transmission electron microscopy was utilized to determine whether a similar silicate would form during HfO$_2$ deposition on a delta doped silicon wafer. (See, e.g., Won, Y. et al., *Appl Phys Lett* 87, 262901, doi:10.1063/1.2150250 (2005), the disclosure of which is incorporated herein by reference.) Note that there is an air exposure between the delta-doping process and the deposition of the ALD AR coating, so a native oxide silicon oxide is present prior to the ALD process. The TEM image in FIG. 9 shows that a large interfacial layer has formed between the ALD hafnium oxide (the dark layer at the top of the image) and the crystalline silicon substrate. This is interpreted to be a hafnium silicate. Because this silicate layer was observed, a 2 nm ALD aluminum oxide film was deposited in situ as a barrier, immediately prior to the ALD HfO$_2$ deposition during all further ALD HfO$_2$ AR coating experiments. A high resolution TEM image of this ALD bilayer is shown at left in FIG. 9. This image confirms that a high density, nanocrystalline HfO$_2$ film is produced and chemical interactions between the HfO$_2$ and the silicon are blocked.

Figure 10:
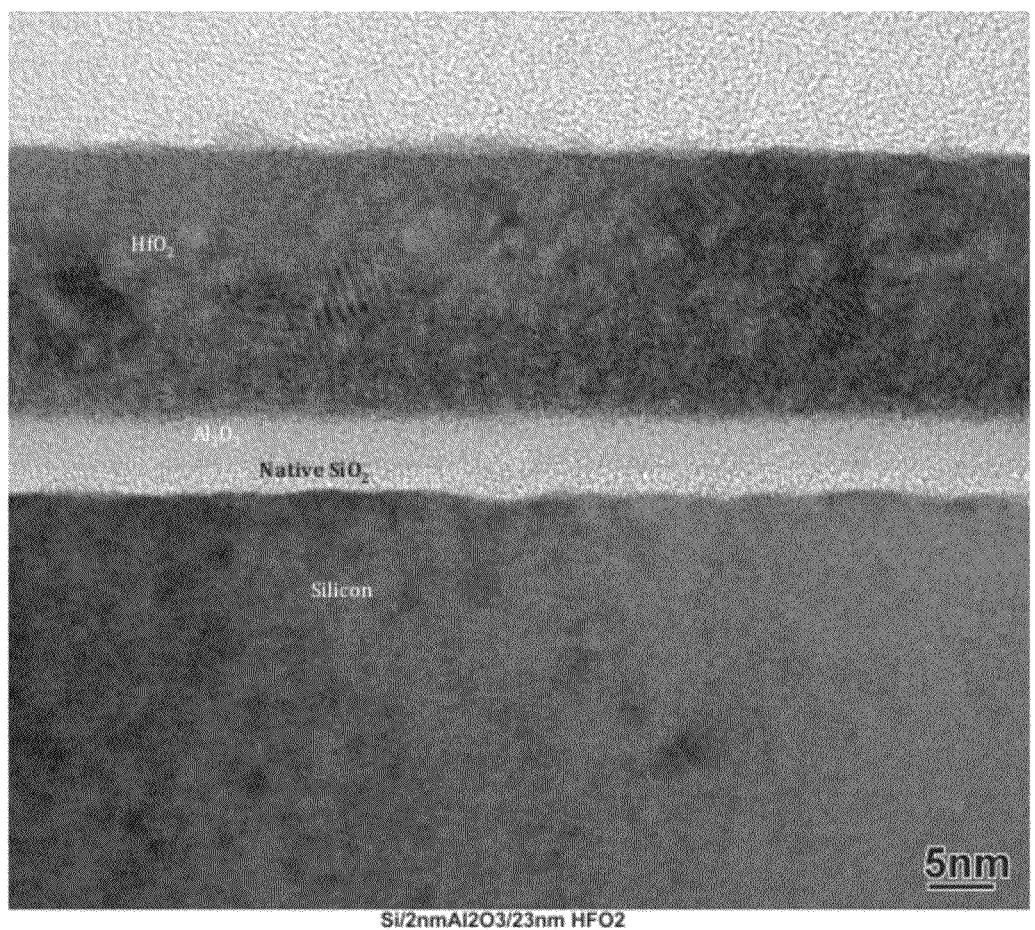
FIG. 10 provides TEM images of a PEALD $HfO_2/Al_2O_3$ bilayer frown on a delta-doped silicon wafer in accordance with the current invention.
Figure 11:
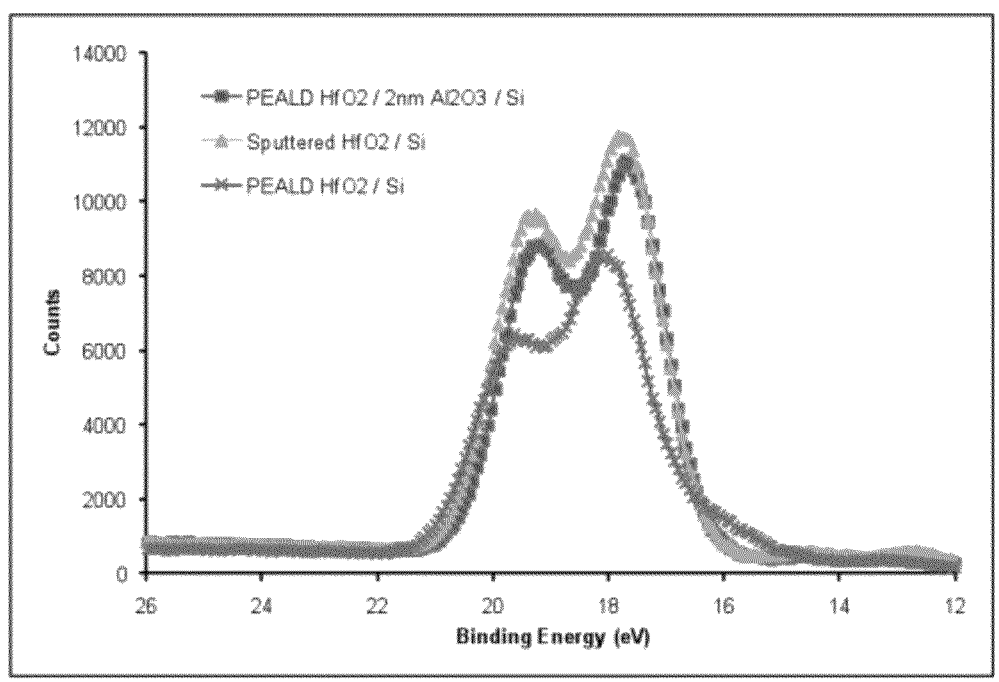
FIG. 11 provides data plots for high resolution hafnium 4f XPS scans for three hafnium oxide AR coatings in accordance with the current invention.
Figure 12:
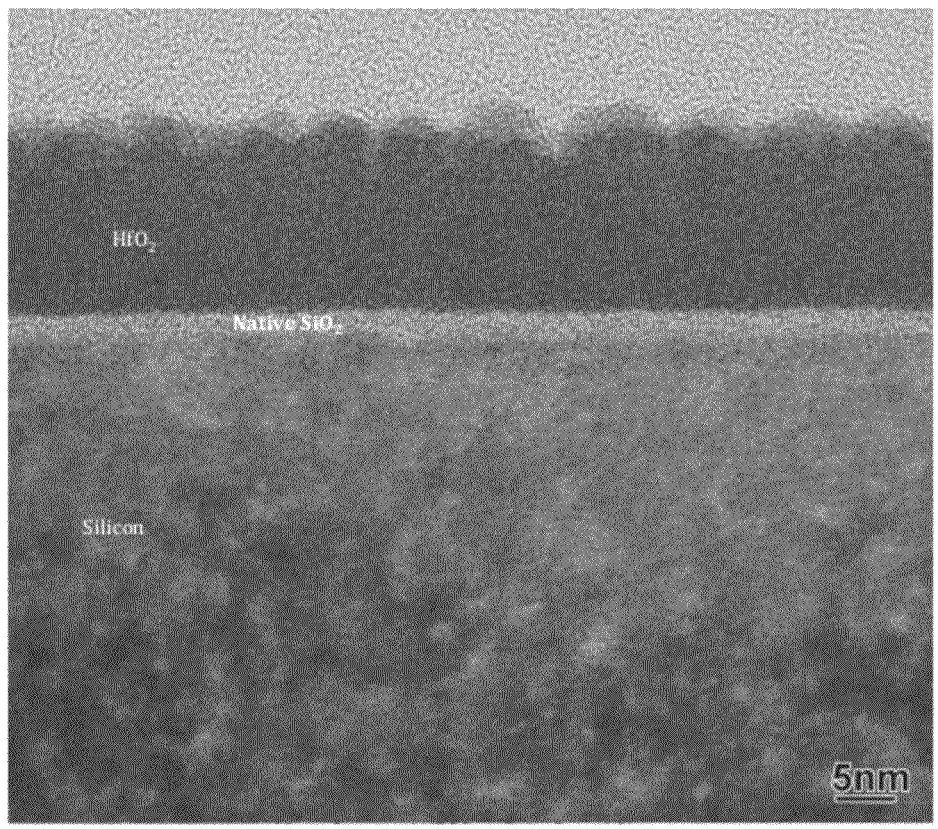
FIG. 12 provides a TEM image of a sputter $HfO_2$ thin film on a delta-doped silicon wafer.

X-ray photoelectron spectroscopy (XPS) was employed to provide further confirmation of whether the 2 nm aluminum oxide layer was sufficient to prevent the formation an interfacial silicate layer. Samples were prepared where twenty-five ALD cycles (~1.2 nm) of HfO$_2$ were deposited on silicon and 2 nm of Al$_2$O$_3$ on silicon (as shown in FIG. 10). FIG. 11 shows the high resolution XPS scans for hafnium 4f peaks for these two samples. The absence of the low binding energy tail for the HfO$_2$ grown on the 2 nm Al$_2$O$_3$ barrier layer on silicon confirms the TEM result that 2 nm is sufficient to prevent the formation of absorptive hafnium silicates. FIG. 11 also shows data for the sputtered hafnium oxide film. The sputtered hafnium 4f results appear to be comparable to the ALD bilayer, which suggests that the poor performance of the sputtered hafnium oxide (shown in FIG. 6) is not related to a chemical interaction between the coating and the silicon surface of the CCD. This conclusion is supported by high resolution TEM analysis of a sputtered HfO$_2$ film on delta-doped silicon (FIG. 12). Unlike the case of PEALD HfO$_2$ deposited directly on silicon, there is no evidence of a large silicate interfacial layer. The lighter layer at the boundary is likely the native oxide that forms after the delta-doping process prior to the AR coating deposition. However, the sputtered HfO$_2$ film appears noticeably less dense, amorphous, and rough as compared to the corresponding PEALD HfO$_2$ bilayer (see FIG. 10). This may account for the superior performance of the PEALD bilayer as an AR coating.

EXAMPLE 2

Comparison of ALD and Sputtered Coatings

Figure 13:
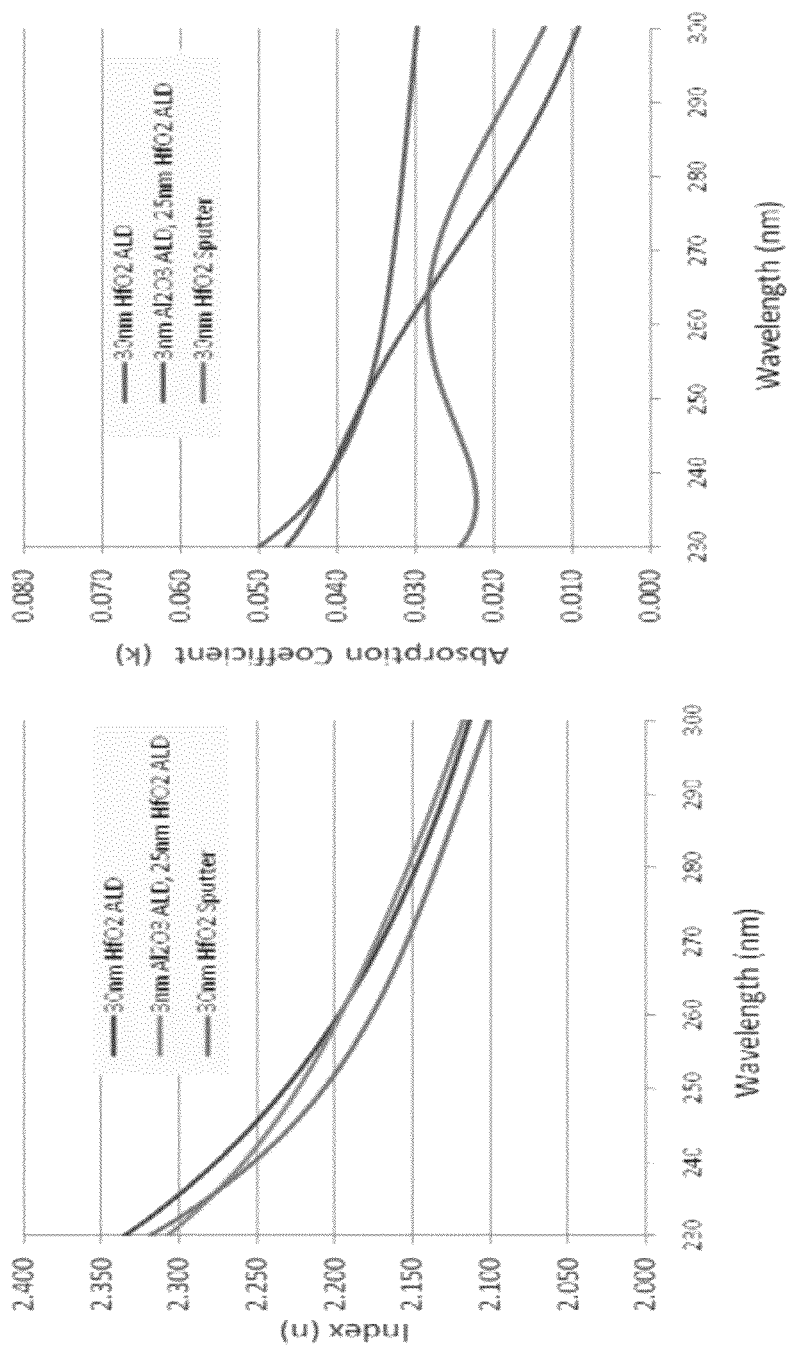
FIG. 13 provides data plots summarizing the optical properties of ALD and sputter deposited AR coatings.

FIG. 13 shows the optical properties of the HfO$_2$ ALD AR single and bilayer coatings as compared to the sputtered HfO$_2$ thin films. These three coatings were deposited on 1 inch diameter silicon substrates and the optical properties were calculated by J.A. Woollam inc. using ultraviolet spectroscopic ellipsometry. The roughness values, as estimated by the model fits, for the two ALD samples were substantially lower than the sputtered HfO$_2$ sample (1.3 nm vs 3.5 nm). The superiority of the aluminum oxide/hafnium oxide ALD bilayer as compared HfO$_2$ alone is clear both from the effective index of refraction of the deposited films and the lower absorption coefficient. This supports the conclusion that the hafnium component of the PEALD bilayer stack has a higher density than the sputtered film. It also is consistent with the XPS observation that the HfO2 in the PEALD bilayer has not reacted with the silicon substrate. These TEM, XPS, and ellipsometry observations provide insight into the mechanisms for the degradation of the quantum efficiency of the sputtered AR coatings.

EXAMPLE 3

Comparison of ALD Coatings

Figure 14:
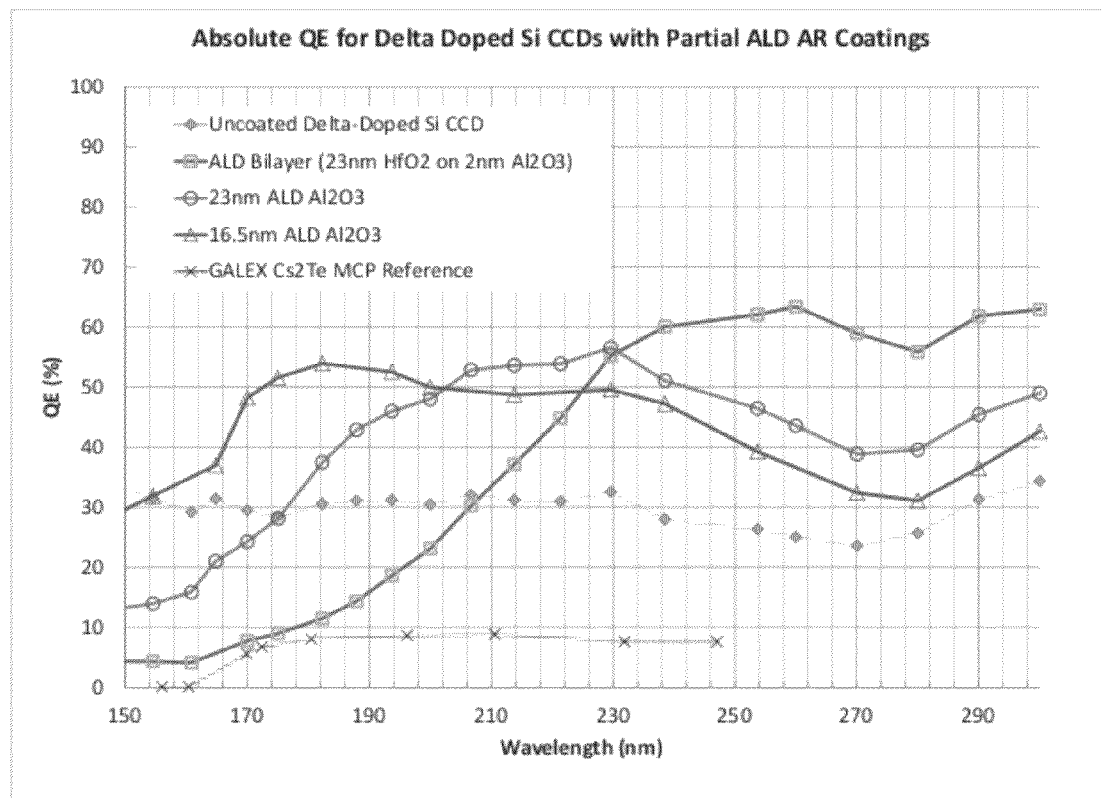
FIG. 14 provides data plots showing the quantum efficiency for AR coated delta-doped-CCDs compared against that of uncoated delta-doped-CCDs and the multi-channel plate onboard GALEX.

FIG. 14 shows the quantum efficiency measured for the three different ALD AR coatings characterized in this study. The performance of one of the uncoated sides of these is presented as a reference for all three CCDs. The thicknesses of these ALD coatings were selected to maximize quantum efficiency over this range, dividing the spectra into three different near ultraviolet (NUV) and far ultraviolet (FUV) bands. The bands selected were: 170 to 200 nm, 190 to 240 nm, and 230 to 300 nm. As shown, through judicious choices of these coatings and their thicknesses, the absolute quantum efficiency can be maintained above 50% for the entire range from 170 nm to 300 nm.

Summary

To date, no anti-reflection coatings have been successfully demonstrated for silicon based imagers in the 100 nm-250 nm range of the ultraviolet spectrum. The current invention is the first successful approach that can be generalized to this entire wavelength range due to its ability to produce high quality $Al_2O_3$, MgO, $MgF_2$, $SiO_2$, and $HfO_2$ coatings. In addition, extremely thin ALD Al2O3 layers (~1 nm thick) are used as buffer layers between the MBE delta-layer and the potentially reactive AR coatings. The 1 nm ALD Al2O3 is sufficiently thin to be optically inactive, but thick enough to be a chemical barrier to preserve separation the silicon and AR coatings. This approach of ultra-thin barrier layers embedded in multilayer AR coatings can only be accomplished with ALD. The ability to apply these coatings immediately after MBE growth enables complete freedom and flexibility to design the highest quality interface between the AR coating and the silicon imager such that the coating can be grown with atomic smoothness and continuity across the substrate. The application of these coatings without vacuum air break also enables precise control and design of the imager AR coating interface.

Doctrine of Equivalents

Those skilled in the art will appreciate that the foregoing examples and descriptions of various preferred embodiments of the present invention are merely illustrative of the invention as a whole, and that variations in the steps and various components of the present invention may be made within the spirit and scope of the invention. Accordingly, the present invention is not limited to the specific embodiments described herein but, rather, is defined by the scope of the appended claims.

What is claimed is:

1. An imager comprising:
an imager substrate having at least a first surface at one end thereof, said surface being passivated with a passivation layer comprising at least a delta-doped layer, the delta-doped passivation layer having an atomic monolayer composition profile having an out-of-plane atomic size scale precision of less than 2 nm, and forming a passivated substrate surface such that the delta-dope passivation layer does not interrupt the imager substrate epitaxy;
an anti-reflective coating formed on at least a portion of said passivated substrate surface, said anti-reflective coating formed of at least one dielectric material selected to allow imaging across a selected spectral range, and being chemically compatible with the delta-doped layer;
wherein the anti-reflective coating is formed of a plurality of layers of the at least one dielectric material, each layer being formed with a thickness of from 0.1 to 3 Angstroms, the anti-reflective coating being disposed on the passivated substrate surface with a density sufficient to ensure that the anti-reflective coating covers the passivated surface continuously on an atomic size scale, such that the anti-reflective coating has a low density of atomic scale defects;
wherein where the anti-reflective coating is formed of a material that is chemically reactive with the imager substrate further comprising an optically inactive barrier layer disposed between the imager substrate and the anti-reflective coating;
wherein at least the barrier layer and the layers of the anti-reflective coating disposed proximal to the passivated substrate surface conform to the passivated substrate surface such that an interfacial region having an out-of-plane roughness of less than about 3 nm is formed between said passivated substrate surface and the barrier layer and anti-reflective coating; and
wherein the imager is formed having an absolute quantum efficiency of at least 50% over at least a portion of the wavelength range of 100 to 300 nm.

2. The imager of claim 1, wherein the first surface is the backside surface of the imager, and wherein the substrate further comprises a frontside surface disposed opposite said backside surface, and wherein the imager electronics are disposed on the frontside surface thereof.

3. The imager of claim 2, wherein the substrate is a silicon wafer.

4. The imager of claim 3, wherein the passivation delta-doped layer is achieved by delta-doping disposed on at least the first surface of the imager substrate.

5. The imager of claim 1, wherein the dielectric material is selected from the group consisting of $Al_2O_3$, $TiO_2$, $SnO_2$, MgO, ZnO, $HfO_2$, $MgF_2$, and $SiO_2$.

6. The imager of claim 1, wherein the anti-reflective coating comprises at least two layers of the at least one dielectric material.

7. The imager of claim 6, wherein the at least two layers are formed from different dielectric materials.

8. The imager of claim 7, wherein the at least one layer formed proximal to the substrate is formed of a dielectric material suitable to act as a barrier layer between the distal anti-reflective coating and the underlying substrate surface.

9. The imager of claim 8, wherein the barrier layer is formed of $Al_2O_3$ and at least a second distal layer is formed of $HfO_2$.

10. The imager of claim 9, wherein the $Al_2O_3$ has a thickness of no greater than 3 nm.

11. The imager of claim 1, wherein the dielectric material is selected such that the imager may operate in a spectral region of between 170 to 300 nm.

12. The imager of claim 1, wherein the imager is a charge-coupled device.

13. The imager of claim 1, wherein the imager has an absolute quantum efficiency above 70% for the selected spectral range.

14. The imager of claim 1, wherein the dielectric coating is formed without exposing said imager substrate to the external atmosphere.

15. An imager comprising:
an imager substrate having at least a first surface at one end thereof, said surface being passivated with a passivation layer comprising at least a delta-doped layer comprising at most an atomically thick sheet of a doped passivation material disposed no greater than 2 nm from the imager substrate surface and having an out-of-plane composition profile having atomic size scale precision;
an anti-reflective coating formed on at least a portion of said at least first passivated surface being disposed such that no adventious carbon is disposed between said anti-reflective coating and said passivated surface, said anti-reflective coating formed of at least one dielectric material selected to allow imaging across a selected spectral range;
wherein at least the barrier layer and the layers of the anti-reflective coating disposed proximal to the passivated substrate surface conform to the passivated substrate surface such that an interfacial region having an out-of-plane roughness of less than about 3 nm is formed between said passivated substrate surface and the barrier layer and anti-reflective coating;
wherein the anti-reflective coating has an overall thickness of no greater than about 25 nm and is formed of a plurality of layers of the at least one dielectric material, each layer being formed with a thickness of from 0.1 to 3 Angstroms and wherein at least the anti-reflective layers proximal to the imager substrate have an out of plane roughness of less than about 3 nm such that the anti-reflective coating is disposed on the passivated surface with a density sufficient to ensure that the anti-reflective coating covers the passivated surface continuously on an atomic size scale, such that the anti-reflective coating has a low density of atomic scale defects, and such that the anti-reflective coating forms an interfacial layer with the passivated surface with an atomic size scale precision and smoothness; and wherein the imager is formed having an absolute quantum efficiency of at least 50% over at least a portion of the wavelength range of 100 to 300 nm.

* * * * *